(12) United States Patent
Day et al.

(10) Patent No.: US 6,470,484 B1
(45) Date of Patent: Oct. 22, 2002

(54) SYSTEM AND METHOD FOR EFFICIENT LAYOUT OF FUNCTIONALLY EXTRANEOUS CELLS

(75) Inventors: Brian A. Day, Colorado Springs, CO (US); Coralyn S. Gauvin, Colorado Springs, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/573,806

(22) Filed: May 18, 2000

(51) Int. Cl.$^7$ .............................................. G06F 17/50
(52) U.S. Cl. ................. 716/8; 716/2; 716/3; 716/4; 716/510; 716/14; 716/16; 716/13; 716/18; 370/474; 714/45; 714/724; 326/41; 703/14
(58) Field of Search ................. 716/4, 7, 8, 17

(56) References Cited

U.S. PATENT DOCUMENTS

| | | | | |
|---|---|---|---|---|
| 4,686,629 A | * | 8/1987 | Noto et al. ............... | 716/9 |
| 5,210,699 A | * | 5/1993 | Harrington ............... | 716/5 |
| 5,224,057 A | * | 6/1993 | Igarashi et al. .......... | 716/13 |
| 5,331,570 A | * | 7/1994 | Bershteyn ................. | 716/4 |
| 5,416,722 A | * | 5/1995 | Edwards .................. | 716/2 |
| 5,436,849 A | * | 7/1995 | Drumm .................... | 716/18 |
| 5,469,368 A | * | 11/1995 | Agrawal et al. ......... | 716/16 |
| 5,625,567 A | * | 4/1997 | Mankin et al. .......... | 716/3 |
| 5,627,999 A | * | 5/1997 | Cheng et al. ............ | 716/8 |
| 5,638,292 A | * | 6/1997 | Ueda ....................... | 716/8 |
| 5,799,170 A | * | 8/1998 | Drumm et al. .......... | 716/2 |
| 5,809,037 A | * | 9/1998 | Mathewson .............. | 714/724 |
| 5,815,655 A | * | 9/1998 | Koshiyama .............. | 714/45 |
| 5,818,726 A | * | 10/1998 | Lee ........................ | 716/10 |
| 5,926,398 A | * | 7/1999 | Nakamura ............... | 716/10 |
| 6,020,760 A | * | 2/2000 | Sample et al. .......... | 326/41 |
| 6,021,135 A | * | 2/2000 | Ishihara et al. ......... | 370/474 |
| 6,026,225 A | * | 2/2000 | Iwasaki ................... | 716/10 |
| 6,028,991 A | * | 2/2000 | Akashi .................... | 716/14 |
| 6,031,982 A | * | 2/2000 | Truong et al. ........... | 716/16 |
| 6,289,412 B1 | * | 9/2001 | Yuan et al. .............. | 703/14 |

* cited by examiner

*Primary Examiner*—Matthew Smith
*Assistant Examiner*—Andrea Liu
(74) *Attorney, Agent, or Firm*—Barnes & Thornburg

(57) ABSTRACT

A method for defining electrical components enables a layout tool to include functionally extraneous cells in an integrated circuit design without significant adverse impact to the operation of the logically functional cells. The method defines the description of a first functionally extraneous cell for a layout tool so an initial layout of the die produced by the layout tool does not functionally couple the first functionally extraneous cell to a second functionally extraneous cell. The description of the functionally extraneous cell is altered so that the layout tool produces a second layout of the die that functionally couples the first and second functionally extraneous cells without altering the position of the second functionally extraneous cell with respect to a logically functional cell. The description of the functionally extraneous cell complies with the description constraints for cells. However, by describing the functionally extraneous cell so that it is first lacks a functional coupling to another extraneously functional cell and then changing the description to functionally couple the two cells, the position of the second functional cell with respect to a functional cell remains unchanged. In this manner, the advantages of the layout tool may be used to most efficiently locate the cells of the logically functional cells and then couple test circuitry or other functionally extraneous circuits without adversely impacting the operation of the functional logic in a significant way.

10 Claims, 4 Drawing Sheets

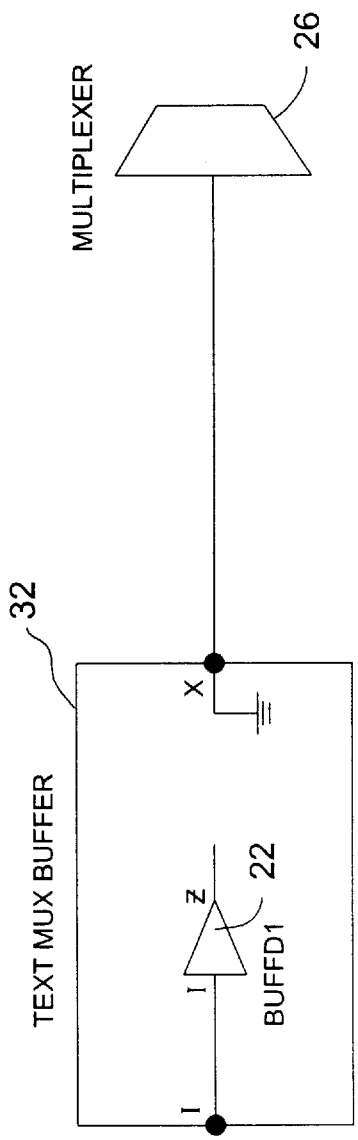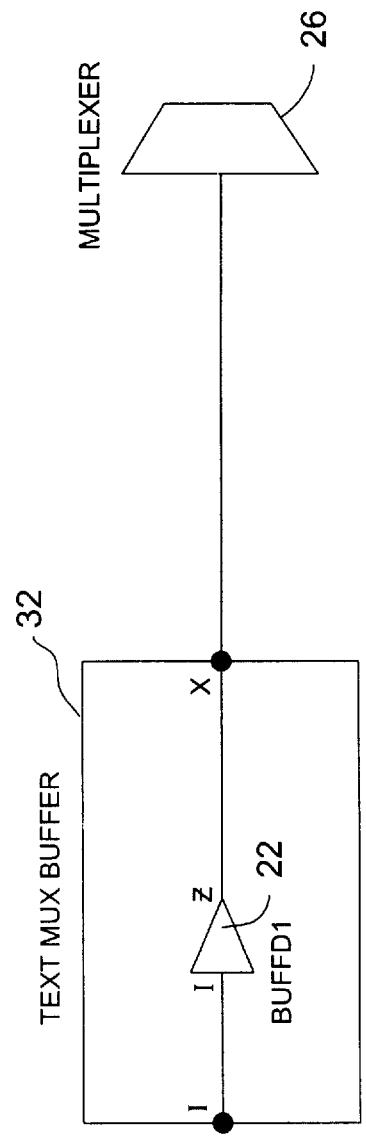

SYSTEM AND METHOD FOR EFFICIENT LAYOUT OF FUNCTIONALLY EXTRANEOUS CELLS

FIELD OF THE INVENTION

This invention relates generally to methods and systems for locating circuitry cells on the die area of an integrated circuit and, more particularly, to methods and systems for efficiently locating circuitry cells not implementing a portion of the integrated circuit function.

BACKGROUND OF THE INVENTION

The design of an integrated circuit requires both a logical design and a physical layout. The logical design includes the determination of the interconnections between functional cells to implement the intended function of an integrated circuit. Functional cells are usually groups of transistors that implement a fundamental logical function such as an inverter or a logical OR function. The logical design of an integrated circuit determines the number of functional cells required for an integrated circuit. While the functional cells that implement the logic of an integrated circuit are the only cells required for an integrated circuit, other logical functions are usually included in an integrated circuit. One additional logical function is test circuitry. Test circuitry is usually provided for design debugging and troubleshooting. Typically, test circuitry includes a buffer for conditioning signals and electrically isolating the test circuitry from the functional logic of the integrated circuit when the test circuitry is not being used. When activated, test circuitry couples normally unavailable signals from the functional logic of the integrated circuit to the output pads for observation. In this document, cells used for other logical functions that do not directly implement the function of the integrated circuit are called functionally extraneous cells.

Once the logical design for the functional logic of an integrated circuit and any other logical functions is complete, the physical layout of the cells must be determined. Typically, layout tools implemented with computer programs are used to locate the cells required for the logical design of an integrated circuit. These layout tools may use certain constraints for placement of the functional cells. For example, input and output buffers are typically located in proximity to the input and output pads for the integrated circuit. Other functionally extraneous cells are distributed throughout the area of the die on which the cells are arranged for the integrated circuit. Once the cells are located on the die by a layout tool, the tool determines the interconnections between the cells that correspond to the logical design of the integrated circuit.

One problem that arises from the use of layout tools is a typical constraint of layout tools to balance the interconnections between cells to minimize problems caused by the capacitance and resistance of interconnections. That is, a layout tool attempts to locate cells so the interconnections between cells are approximately the same length. In this manner, the performance of one cell is not significantly impacted by signal transmission over interconnections having a length that is long relative to interconnections between other cells. While this constraint is generally useful when the cells being interconnected form a portion of the functional logic of the integrated circuit, it is not necessarily efficient when a cell being interconnected is a functionally extraneous cell. For example, a cell containing test circuitry, such as a signal multiplexer, may have a cell having signal buffers in it, interposed between the multiplexer and a state machine that comprises the functional logic of the integrated circuit. If the buffer cell, multiplexer cell, and a state machine cell are all located equally from one another, the length of the interconnection required between the state machine cell and the buffer may affect the state machine timing. That is, the shorter the interconnection between the buffer and state machine cells, the less adverse the impact of the capacitance and resistance of the interconnection between the buffer and state machine is on the state machine timing.

What is needed is a method for differentiating between functionally extraneous cells and logical functional cells for locating cells on an integrated circuit die.

What is needed is a method for interconnecting functionally extraneous cells with logically functional cells to minimize the impact of the functionally extraneous cells on the logically functional cells.

SUMMARY OF THE INVENTION

The above-noted limitations of previously known systems and methods for locating cells on a die of an integrated circuit have been overcome by a system and method operating in accordance with the principles of the present invention. The method of the present invention is comprised of defining the description of a first functionally extraneous cell for a layout tool so an initial layout of the die produced by the layout tool includes the first functionally extraneous cell without functionally coupling the first functionally extraneous cell to a second functionally extraneous cell; and altering the description of the first functionally extraneous cell so that the layout tool produces a second layout of the die that functionally couples said first functionally extraneous cell to said second functionally extraneous cell whereby the position of the second functionally extraneous cell with respect to a logically functional cell does not change between the first and second layouts. The description of the functionally extraneous cell complies with the description constraint for cells. However, by describing the functionally extraneous cell so that it is not functionally coupled to a logically functional cell, the layout tool locates the functionally extraneous cell closer to the logically functional cell than if the functionally extraneous cell is functionally coupled to both the logically functional cell and another functionally extraneous cell. In this manner, the advantages of the layout tool may be used to most efficiently locate the cells of the logically functional cells and then couple test circuitry or other functionally extraneous cells without adversely impacting the operation of the functional logic in a significant way.

These and other advantages and features of the present invention may be discerned from reviewing the accompanying drawings and the detailed description of the invention.

BRIEF DESCRIPTION OF THE DRAWINGS

The present invention may take form in various components and arrangement of components and in various steps and arrangement of steps. The drawings are only for purposes of illustrating an exemplary embodiment and are not to be construed as limiting the invention.

FIG. 2 is a depiction of an intermediate hierarchical level that may be used to describe a function for a library cell to be included on the die of FIG. 1;

FIG. 5 is a depiction of an altered intermediate hierarchical level that may be used to describe a function for a library cell to be included on the die of FIG. 1.

DETAILED DESCRIPTION OF THE INVENTION

Layout tools are computer programs that provide descriptions of the electrical components that are interconnected to form the circuitry that populates a die for an integrated circuit. The rules regarding the interconnections and components may be defined by operating parameters of the layout tool and designer defined descriptions of the electrical components. The layout tool places the components on an area map that corresponds to the physical dimensions of the die for the integrated circuit. Following the initial description of the operating parameters and electrical components interconnections, the layout tools may be activated to generate an area map of the integrated circuit die. That map may be checked for accuracy. Descriptions that result in errors may be changed and, if any circuitry changes have been made, descriptions conforming to those changes may be provided to the layout tool. Executing the layout tool with these new descriptions results in another area map that may be reviewed for detecting errors. This iterative cycle continues until the area map is deemed to be accurate for fabrication of the die for the integrated circuit. The data corresponding to the approved area map is then used to fabricate the die.

Figure 1:
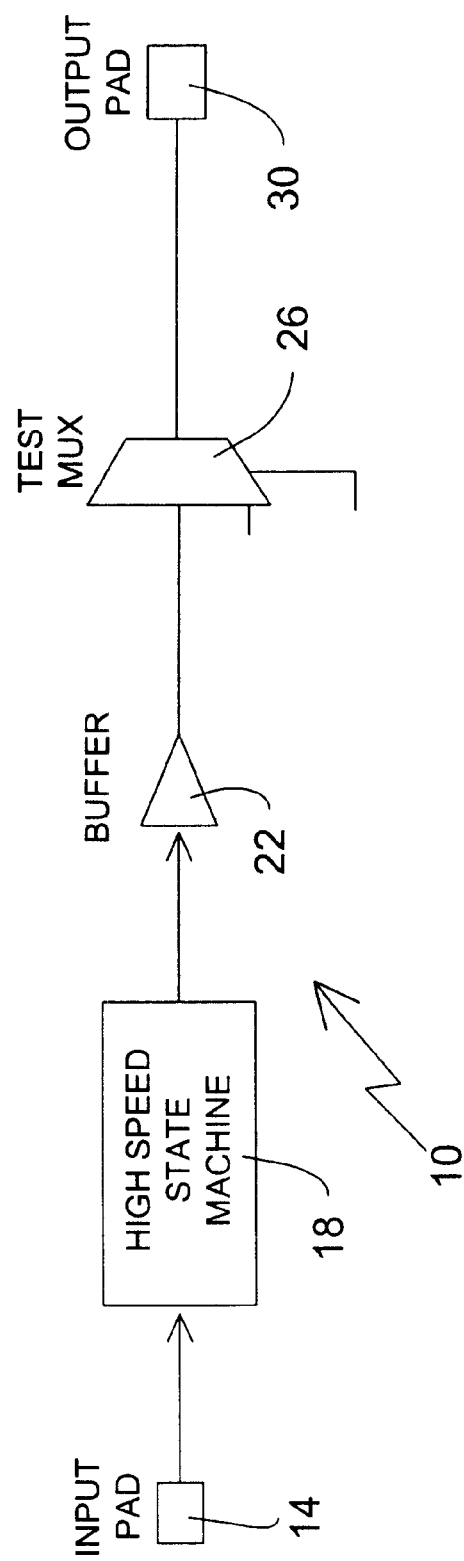
FIG. 1 depicts a block diagram of electrical components that may be included on the die of an integrated circuit for making signals internal to a high speed state machine accessible for testing.

For example, the electrical components for a die 10 are shown in FIG. 1. Die 10 includes an input pad 14, a high speed state machine 18, a signal buffer 22, a signal multiplexer 26, and an output pad 30. High speed state machine 18 is comprised of one or more electrical components that implement all or a portion of the function designed for die 10; however, it is shown as a single block for purposes of illustration only. High speed state machine 18 may be any timing sensitive circuitry or the like. Also, a typical integrated circuit includes other circuitry to implement the complete functionality of the integrated circuit. These additional components have not been depicted to facilitate the reader's understanding of the present invention.

In FIG. 1, signal buffer 22 and signal multiplexer 26 comprise test circuitry for making signals coupled to signal buffer 22 from high speed state machine 18 available at the output pins of the integrated circuit through multiplexer 26 and output pad 30. Because signal buffer 22 and signal multiplexer 26 comprise test circuitry, a signal(s) indicating test mode is active for the integrated circuit activates the test function that these components implement. In this example, high speed state machine 18, input pad 14, and output pad 30 are all implemented with logically functional cells while signal buffer 22 and multiplexer 26 are implemented with functionally extraneous cells. All of the cells provide logical functions and are obtained from a library of logical cells. Hence they are typically called library cells. An intermediate hierarchical level is typically defined for library cells to specify a function for a library cell included on an integrated circuit die. For example, test multiplexer buffer 32 is an intermediate hierarchical level defined for signal buffer 22 as shown in FIG. 2.

Figure 3:
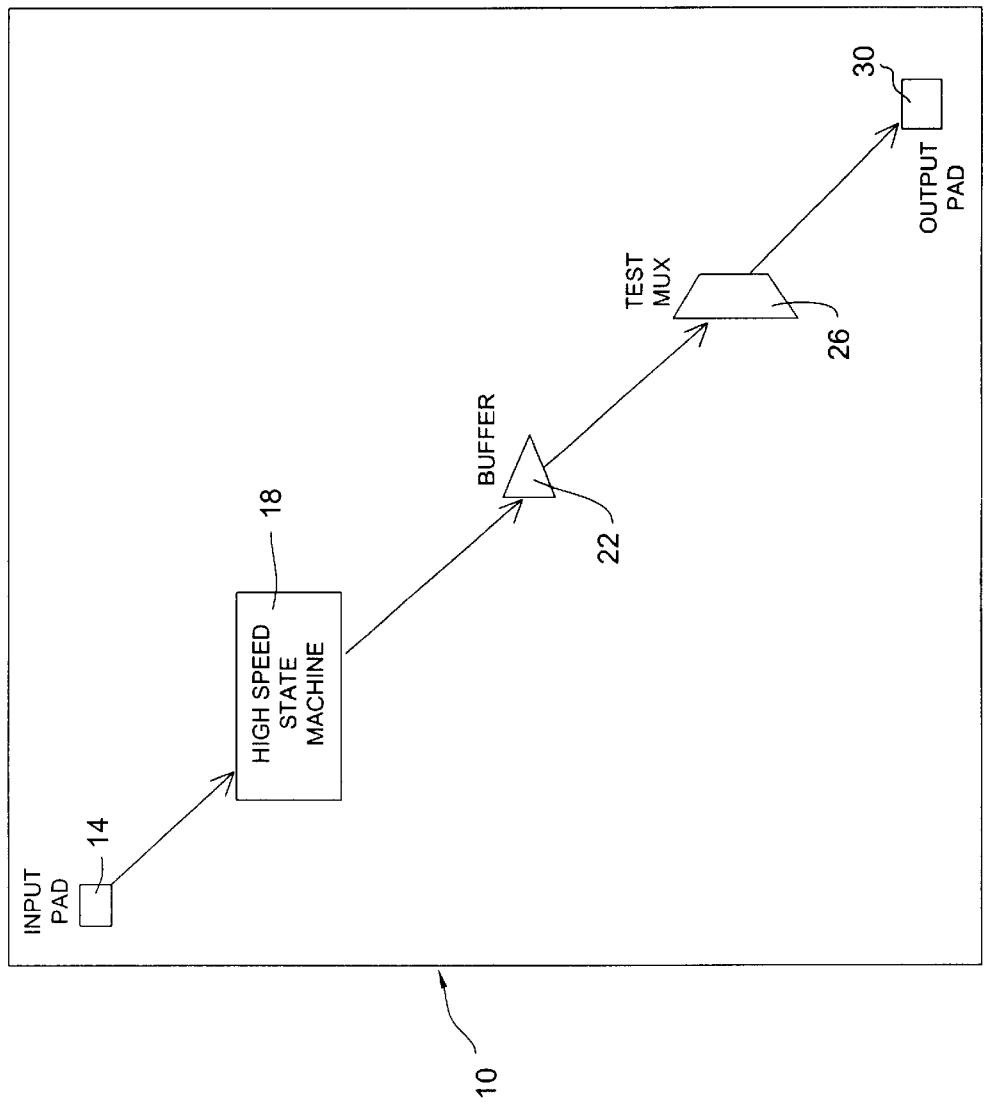
FIG. 3 is a depiction of exemplary physical locations for cells that implement the components of FIG. 1 produced by a layout tool without the description altering method of the present invention.

Identifying the interconnections for the components shown in FIG. 1 in descriptions for a layout tool would result in an area map placing the components in the exemplary manner shown in FIG. 3. Because layout tools process the descriptions as all being logically functional components of the integrated circuit function, the layout tool places the components at an approximately equal distance to meet the balance operating parameter. The balance operating requirement causes the layout tool to separate the components by an equal distance to reduce the adverse consequences on circuitry timing that may be caused by capacitance and resistance in longer interconnections. Unfortunately, this requirement causes the interconnection between signal buffer 22 and high speed state machine 18 to be longer than necessary. The capacitance and resistance of the longer interconnection increase the load that state machine must drive and, as a consequence, the timing of state machine 18 is adversely impacted. If signal buffer 22 could be placed closer to state machine 18, the output load on state machine would be reduced and its timing enhanced. Although the longer interconnection that would result between buffer 22 and multiplexer 26 would increase the load driven by signal buffer 22, such a result may be tolerated because functionally extraneous cells such as multiplexer 26 only operate when timing is not as critical.

Figure 4:
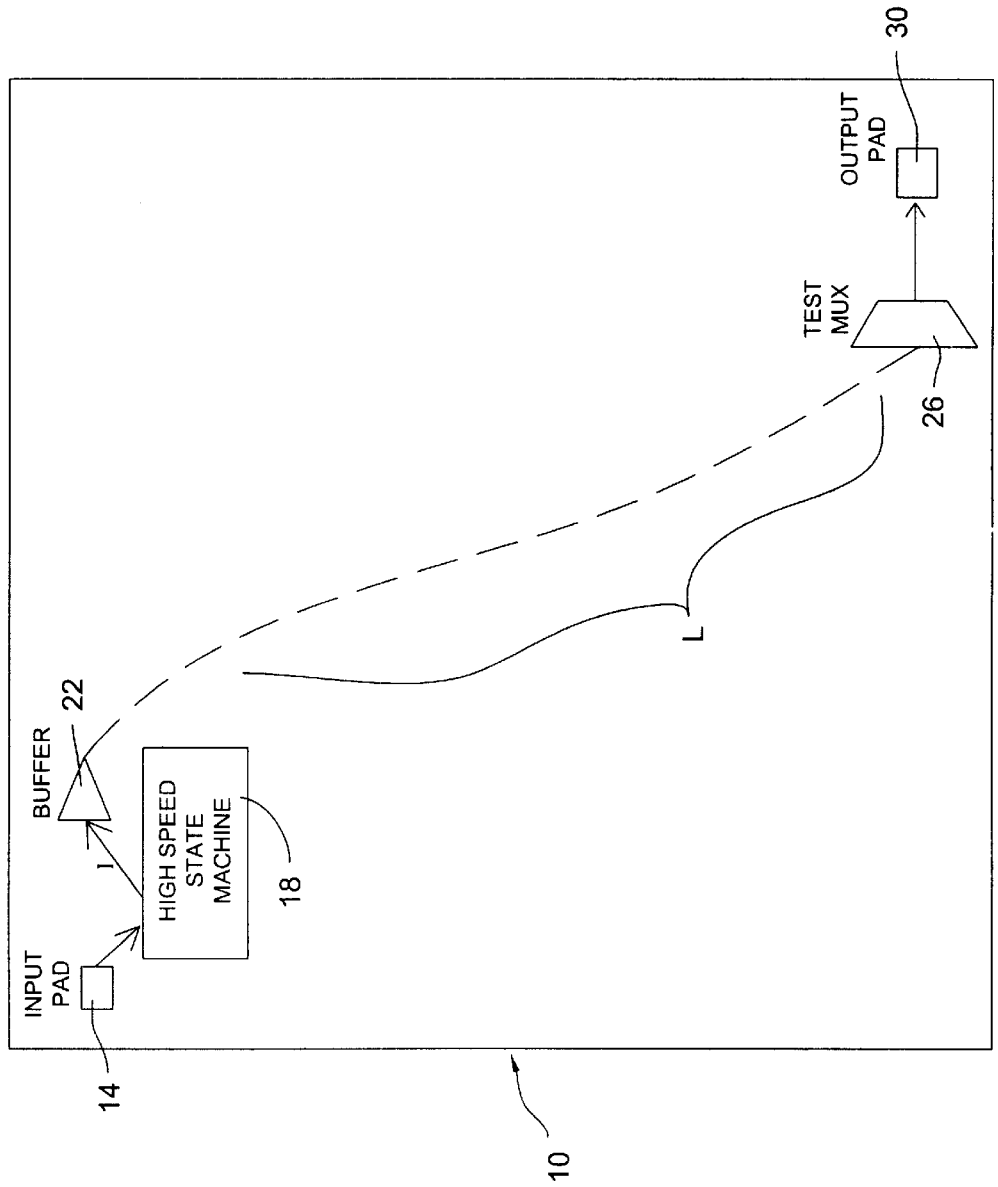
FIG. 4 is a depiction of exemplary physical locations for cells that implement the components of FIG. 1 produced by a layout tool using the description altering method of the present invention.

Using the technique of the present invention, the description of signal buffer 22 at the intermediate hierarchical level may be first defined so its outputs are interconnected to signal ground. This description allows the outputs of the library cell for buffer 22 to 'float' and the input of multiplexer 26 to be interconnected to the output of test multiplexer buffer 32 as shown in FIG. 2. In response to this description, a layout tool places test multiplexer buffer 32 and the library cell for signal buffer 22 as close to state machine 18 as permitted by the other constraints in the layout tool. This distance is likely to be appreciably shorter than the distance between buffer 22 and state machine 18 as shown in FIG. 4. This shorter distance is represented by the distance I shown in FIG. 4. Then the description of test multiplexer 32 is altered so its output is interconnected to the output of buffer 22. The logical effect of this alteration is shown in FIG. 5. Executing the layout tool to incorporate engineering change orders (ECOs) with this altered description along with other changes as typically determined after initial area map generation causes the layout tool to generate an area map as shown in FIG. 4. The distance I between signal buffer 22 and state machine 18 does not change but the interconnection between signal buffer 22 and multiplexer 26 as defined by the new multiplexer description has a length L that is longer than I.

This technique has been used with a layout tool known as the Apollo tool that is available from Avanti of Sunnyvale, Calif. This is a publicly available commercial product and requires an adequate computer platform as specified by the manufacturer. With this layout tool, the following code may be used to describe test multiplexer buffer 32 for the initial area map generation:

Module TestMuxBuffer (I, X); //module for test multiplexer buffer
BUFFD1(.I(I), Z( )); //defines the interconnections
assign X=1b'O; //ties test multiplexer buffer input to VSS
endmodule;

This code couples the output of test multiplexer buffer 32 to signal ground so the output of signal buffer 22 'floats' and, in response, the layout tool places test multiplexer buffer 32 and its library cell for signal buffer 22 closer to state machine 18 than if its output were interconnected to multiplexer 26. By describing the interconnection between multiplexer 26 and signal buffer 22 in a manner that does not functionally couple signal buffer 22 between state machine 18 and multiplexer 26, the layout tool does not place signal buffer 22 in a location that adversely impacts the timing of state machine 18 in a significant manner. Signal buffer 22 is not functionally coupled to multiplexer 26 because a logical signal path is not formed between the two cells. When the description of multiplexer 26 is altered to:

Module TestMuxBuffer (I, X); //module for test multiplexer buffer

BUFFD1(.I(I), Z(X)); //defines the interconnections endmodule;

The interconnection for the output of the signal buffer is a passed parameter that interconnects the output of the library cell for signal buffer 22 to the output of test multiplexer buffer 32. Because the layout tool does not alter the placement of test multiplexer buffer 32 and signal buffer 22 for the ECO execution, the interconnection to multiplexer 26 is defined without moving signal buffer 22. As a consequence, the operation of the logically functional cells that implement the function of the integrated circuit are not adversely impacted by the functional coupling of the two functionally extraneous cells that implement the test circuitry.

While the present invention has been illustrated by the description of exemplary processes, and while the various processes have been described in considerable detail, it is not the intention of the applicant to restrict or in any way limit the scope of the appended claims to such detail. For example, other layout tools could be used and the changes in the descriptions of components defined to achieve the same objectives of the present invention. Additional advantages and modifications will also readily appear to those skilled in the art. The invention in its broadest aspects is therefore not limited to the specific details, implementations, or illustrative examples shown and described. Accordingly, departures may be made from such details without departing from the spirit or scope of applicant's general inventive concept.

What is claimed is:

1. A method for including functionally extraneous cells on an integrated circuit die without significant adverse impact to logically functional cells of the integrated circuit comprising:

defining the description of a first functionally extraneous cell for a layout tool so an initial area map of the die produced by the layout tool does not functionally couple the first functionally extraneous cell to a second functionally extraneous cell and so an output of the first functionally extraneous cell is defined at an intermediate hierarchical level as being connected to signal ground; and altering the description of the first functionally extraneous cell so that the output of the first functionally extraneous cell is defined at the intermediate hierarchical level as being disconnected from signal ground and so that the layout tool produces a second area map of the die that functionally couples said first functionally extraneous cell to said second functionally extraneous cell whereby the position of the second functionally extraneous cell with respect to a logically functional cell does not change between the first and second layouts.

2. The method of claim 1, wherein:

said functionally extraneous cell implements a signal buffer; and said logically functional cell implements at least a portion of timing sensitive circuitry.

3. The method of claim 1, wherein:

said functionally extraneous cell is included in an intermediate hierarchical level; and said altered description is a description for said intermediate hierarchical level.

4. The method of claim 1, wherein the first logically functional cell comprises a high speed state machine.

5. The method of claim 1, wherein the first functionally extraneous cell comprises a buffer.

6. The method of claim 1, wherein the second logically functional cell comprises an output pad.

7. The method of claim 1, wherein the second functionally extraneous cell comprises a test multiplexer.

8. The method of claim 1, wherein the connection between the first and second functionally extraneous cells is substantially longer than the connection between the first functionally extraneous cell and an associated logically functional cell.

9. The method of claim 1, wherein the connection between the first and second functionally extraneous cells is substantially longer than the connection between the second functionally extraneous cell and the logically functional cell.

10. The method of claim 1, wherein the first functionally extraneous cell is placed as closely as possible to an associated logically functional cell as governed by a program that generates the first layout.

* * * * *